(12) United States Patent
Akiyama

(10) Patent No.: US 7,510,226 B2
(45) Date of Patent: Mar. 31, 2009

(54) NON-CONTACT HOLDER DEVICE AND NON-CONTACT HOLDING AND CONVEYING DEVICE

(76) Inventor: Izumi Akiyama, 8-22-4, Chuo, Ohta-Ku, Tokyo (JP) 143-0024

( * ) Notice: Subject to any disclaimer, the term of this patent is extended or adjusted under 35 U.S.C. 154(b) by 388 days.

(21) Appl. No.: 10/551,453

(22) PCT Filed: Feb. 23, 2005

(86) PCT No.: PCT/JP2005/002915

§ 371 (c)(1),
(2), (4) Date: Sep. 29, 2005

(87) PCT Pub. No.: WO2005/086225

PCT Pub. Date: Sep. 15, 2005

(65) Prior Publication Data

US 2006/0290151 A1    Dec. 28, 2006

(30) Foreign Application Priority Data

Mar. 3, 2004    (JP) ............................. 2004-059660

(51) Int. Cl.
*B25J 15/06*    (2006.01)
(52) U.S. Cl. ..................... 294/64.3; 414/941
(58) Field of Classification Search ................. 294/64.3, 294/64.1; 901/40; 271/97; 414/941
See application file for complete search history.

(56) References Cited

U.S. PATENT DOCUMENTS

| | | | | |
|---|---|---|---|---|
| 3,438,668 A | * | 4/1969 | Williams et al. | 294/64.3 |
| 3,523,706 A | * | 8/1970 | Logue | 294/64.3 |
| 4,029,351 A | * | 6/1977 | Apgar et al. | 294/64.3 |
| 4,118,058 A | * | 10/1978 | Rahn et al. | 294/64.3 |
| 4,903,717 A | * | 2/1990 | Sumnitsch | 137/99.1 |
| 4,921,520 A | * | 5/1990 | Carlomagno | 65/111 |
| 5,169,196 A | * | 12/1992 | Safabakhsh | 294/64.3 |
| 6,322,116 B1 | * | 11/2001 | Stevens | 294/64.3 |

FOREIGN PATENT DOCUMENTS

JP    59-155141    9/1984

(Continued)

*Primary Examiner*—Dean J Kramer
(74) *Attorney, Agent, or Firm*—Barnes & Thornburg LLP

(57) ABSTRACT

A non-contact holder includes: a body 2 having an ejection recess 3 having an ejection opening 3b from which a fluid is ejected and a tapered surface 3c gradually diverging toward the ejection opening; discharge ports 10 provided at positions adjacent to the tapered surface of the ejection recess of the body to discharge the fluid along the tapered surface in the axial direction; a fluid supply channel 7 connected to the discharge ports to supply the fluid; radial flow guides 11 formed on the tapered surface of the ejection recess to guide the flow of the fluid discharged from the discharge ports radially outward from the center of the ejection recess; and a flat end surface 4 formed integrally with the outer edge of the body around the ejection opening and opposed to the surface of a workpiece 5 opposing to the ejection opening to guide the flow of the fluid to the outside of the opposite surface of the workpiece 5. The single non-contact holder having the above structure can hold an object to be held, such as a workpiece, with less noise and lower cost without the rotation of the object.

15 Claims, 8 Drawing Sheets

FOREIGN PATENT DOCUMENTS

| | | |
|---|---|---|
| JP | 62-269826 | 11/1987 |
| JP | 1-161597 | 6/1989 |
| JP | 6-216945 | 5/1994 |
| JP | 8-203984 | 8/1996 |
| JP | 8-316288 | 11/1996 |
| JP | 8-330385 | 12/1996 |
| JP | 10-181879 | 7/1998 |
| JP | 2002-64130 | 2/2002 |

\* cited by examiner

NON-CONTACT HOLDER DEVICE AND NON-CONTACT HOLDING AND CONVEYING DEVICE

CROSS-REFERENCE TO RELATED APPLICATION

This application claims priority based on International Patent Application No. PCT/JP2005/002915, entitled "Non-Contact Holder and Non-Contact Holding and Transferring Device" by Izumi AKIYAMA, which claims priority of Japanese Application No. 2004-059660, filed on Mar. 3, 2004.

TECHNICAL FIELD

The present invention relates to a non-contact holder for holding an object to be held, for example, workpieces such as semiconductor wafers and glass substrates for PDPs (Plasma Display Panels), with no contact (with or in non-contacted (or non-contacting) state) by blowing a fluid such as air onto the object to be held, and also relates to a non-contact holding and transferring device capable of transferring the object held with no contact.

BACKGROUND ART

In a known art for such non-contact holder, when a workpiece (work) such as silicon wafers and semiconductor wafers is transferred to a subsequent step or in the same step in its production process, it has been required to prevent dust deposition and damage to the workpieces, increase in the size of the workpieces and decrease in the thickness thereof. However, such requirements have made it significantly difficult to mechanically and directly hold the workpieces for carriage.

To deal with this problem, a non-contact holder has been proposed (for example, see Patent Document 1: Japanese Unexamined Patent Publication No. 2002-64130). In such conventional non-contact holder, air or nitrogen gas is blown to a workpiece at a predetermined pressure to hold the workpiece in no contact state depending on the balance between positive and negative pressures.

In such conventional non-contact holder, however, because jetting flow of a fluid such as air jetted on the workpiece from a jetting port constitutes a swirling flow, in a case of holding the workpiece in the non-contact state (hereinafter, called "non-contacted state") by one non-contact holder, the workpiece is rotated slightly gradually by the swirling flow of the air and is not held in a stationary state, thus being inconvenient and providing a problem.

In order to solve such problem, as in a panel-type non-contact holder A in FIG. 8, it was necessary to dispose at least two non-contact holders CW and CCW, which produce swirling flows in different directions, for example, a clockwise direction (CW) and a counterclockwise direction (CCW), so as to be adjacent to each other on a panel B.

This non-contact holding unit A, however, requires a plurality of non-contact holders. In addition, two adjacent non-contact holders produce swirling flows that collide with each other and cancel each other on a non-contact holding surface of the workpiece, thereby generating a noise such as wind noise and reducing air supply rate and pressure.

Further, in addition, if the swirling flows produced by the two non-contact holders produce pressure difference (have different pressures), the workpiece rotates by the higher pressure, and accordingly, the air supply rate and pressure to the adjacent non-contact holders CW and CCW must be properly controlled with high accuracy to be substantially uniform.

Even if the pressures of the adjacent swirling flows are substantially uniform, the pressures pushing or pushed to each other act on the workpiece, which causes a strain, and in a case that the workpiece has a thin thickness, the workpiece is undesirably deformed in the thickness direction and vibrated, whereby a noise is caused and the stress is increased, thus being inconvenient.

DISCLOSURE OF THE INVENTION

The present invention was conceived in consideration of the above circumstances and an object thereof is to provide a non-contact holder and a non-contact holding and transferring device capable of holding a workpiece in rotation preventing state even by a single holder, reducing noise and being manufactured at low cost.

The invention includes a non-contact holder which comprises: a body having an ejection recess having an ejection opening from which a fluid is ejected and a side surface gradually diverging toward the ejection opening; discharge ports provided at positions adjacent to the side surface of the ejection recess of the body to discharge the fluid along the side surface in the axial direction; a fluid supply channel provided inside the body and connecting to the discharge ports to supply the fluid to the discharge ports; and a flat end surface formed integrally with an outer edge of the body around the ejection opening so as to oppose to a surface of an object to be held opposing to the ejection opening to guide the flow of the fluid to an outside of the opposite surface of the object to be held.

In an aspect, radial flow guides are formed on the side surface of the ejection recess to guide the flow of the fluid discharged from the discharge ports radially outward from a center of the inner bottom surface of the ejection recess.

In an aspect, the fluid supply channel includes axial flow guides for guiding the flow of the fluid to be discharged from the discharge ports to the side surface of the ejection recess in the axial direction of the side surface of the ejection recess.

In an aspect, the fluid supply channel has a fluid reservoir for storing a required amount of the fluid on a way thereof.

In an aspect, a plurality of fluid supply channels are disposed to be connected respectively to fluid supply ports provided in a peripheral surface of the body in the radial direction.

In an aspect, the discharge ports are provided at positions opposing to each other around the center of the inner bottom surface of the ejection recess, and the radial flow guides extend from the discharge ports to the ejection opening.

In an aspect, the radial flow guides and the axial flow guides are grooves or protrusions.

In an aspect, the radial flow guides are divergent grooves having a width gradually increasing from the discharge ports to the ejection opening and a depth gradually decreasing from the discharge ports to the ejection opening, the divergent grooves being substantially flush with the side surface at the ejection opening or in the vicinity thereof.

In an aspect, the body comprises quartz glass.

In an aspect, the object to be held is a glass plate, a sheet, a resin semiconductor wafer, or a display panel.

In an aspect, the non-contact holder further comprises: a fluid storage tank provided on a way of an external fluid supply channel for connecting the fluid supply channel of the body to a fluid supply source so as to store a required amount of fluid; and a fluid temperature controller for controlling a temperature of the fluid stored in the fluid storage tank.

In an aspect, the non-contact holder further comprises: a grip portion that is provided on the body so as to be held thereby; and a stopper provided on the body to restrict a displacement of the workpiece to the outside of the outer peripheral surface thereof.

In an aspect, the grip portion is formed so as to be attached to and detached from a movable unit.

In an aspect, a non-contact holding and transferring device, comprises: a panel having a plurality of the non-contact holders a movable member which supports the panel reversibly movably in a horizontal direction thereof; and a transferring unit which transfers the movable member.

According to the present invention, the fluid blowing against the object to be held such as workpiece constitutes radial flow, not swirling flow, so that the workpiece can be held statically in the non-contacted state even by using a single non-contact holder. Therefore, the number of the non-contact holders to be disposed can be reduced, and stress and vibration, which may be applied to the object, can be also reduced.

BEST MODE FOR CARRYING THE INVENTION

Figure 1:
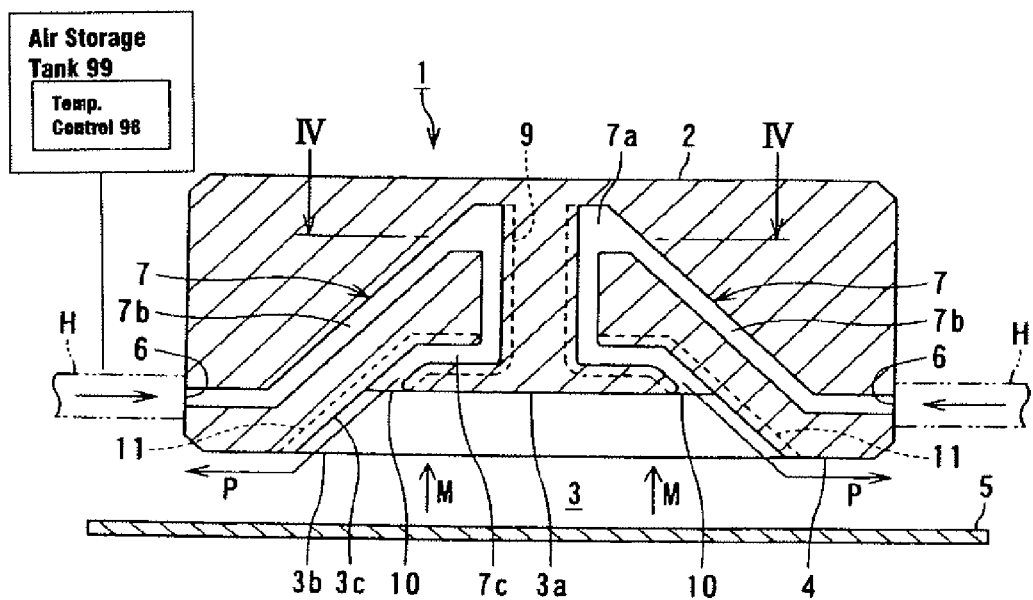
FIG. 1 is a sectional view taken along line I-I in FIG. 2.

Embodiments of the present invention will be described hereunder with reference to the attached drawings, in which the same reference numerals are added to the same or equivalent portions or members.

First Embodiment

Figure 2:
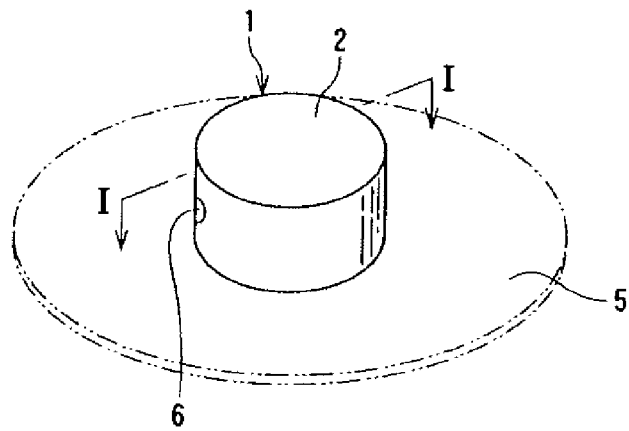
FIG. 2 is a perspective view, from an upper side, of a non-contact holder according to a first embodiment of the present invention.
Figure 3:
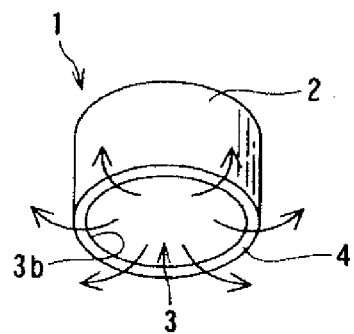
FIG. 3 is also a perspective view, from a bottom side, of the non-contact holder shown in FIG. 2.

FIG. 1 is an elevational sectional view taken along the line I-I in FIG. 2. FIG. 2 is a perspective view of a non-contact holder, from an upper side thereof, according to a first embodiment of the present invention. FIG. 3 is a perspective view thereof from a bottom side.

In these drawings, a non-contact holder 1 has a body 2 made of, for example, a hard glass such as quartz glass, a metal such as aluminum or stainless steel, a ceramic material such as alumina, or a synthetic resin. The body 2 has the shape of, for example, a covered cylinder or prism. An ejection recess 3 having a required depth is provided in the bottom of the body 2. The ejection recess 3 has the shape of, for example, a truncated cone (or a truncated polygonal cone).

The ejection recess 3 has an ejection opening 3b having, for example, a circular shape at the end opposing to an inner bottom surface 3a of the ejection recess 3. A side periphery (side surface) of the ejection recess 3 is a tapered surface 3c which is slightly curved from the inner bottom surface 3a to the ejection opening 3b and gradually diverges outward. The tapered surface 3c may also have a curved shape such as, for example, a bell or a cup shape, or a linear shape.

The body 2 is integrally formed with a flat end surface 4 at its outer peripheral edge on the side of the ejection opening 3b. This flat end surface 4 is opposed to a workpiece 5 such as a silicon wafer or a semiconductor wafer, as an example of an object to be held, at a required distance substantially in parallel with the opposing surface of the workpiece 5, which is held with no contact (called hereinafter "non-contacted state). Further, examples of the object to be held include those that must not be touched directly by hand, such as glass substrates (including quartz substrates) for LCDs, PDPs, and so on, precision components including automobile components, and medical containers, as shown in the industry-specific workpieces in Table 1 below.

TABLE 1

| Industry | Workpiece |
| --- | --- |
| 1. Semiconductor industry | Bare wafers (green wafers), silicon wafers, quartz glass wafers, sapphire glass wafers, GaAs wafers, separators (nonwoven separators), etc. |
| 2. Liquid crystal industry | Bare glass (virgin glass) substrates, liquid crystal glass substrates, color filters, resin substrates, etc. |
| 3. PDP industry | PDP glass substrates, resin substrates, etc. |
| 4. SED industry | Flat SEDs etc. |
| 5. Organic EL industry | Organic EL sheets, prism sheets, organic EL displays, etc. |
| 6. Electronic paper industry | Electronic paper, protective sheets, resin sheets, resin films, etc. |
| 7. Other electronic industries | VDFs, LEDs, FEDs, DLPs, prism sheets, protective sheets, resin sheets, resin films, etc. |
| 8. Medical industry | Medical devices, medical materials such as nonwoven fabrics, etc. |
| 9. Pharmaceutical industry | Medicines, pharmaceutical containers, pharmaceutical materials, etc. |
| 10. Agricultural industry | Expensive agricultural products, package materials for agricultural products, etc. |
| 11. Biotechnology industry | Biological/bacterial raw materials, containers and materials for the raw materials, etc. |
| 12. Automobile industry | Fine components, expensive components, rare components, containers and materials for the components, etc. |

TABLE 1-continued

| Industry | Workpiece |
| --- | --- |
| 13. Other general industries | Glass plates, films, nonwoven fabrics, rare metal sheets, extra-high-grade ultrathin sheets, extra-high-grade ultrathin stone plates, etc. |

A pair of left and right fluid supply ports 6, for example, are formed on the lower peripheral surface of the body 2. Two fluid supply channels 7 connecting to the fluid supply ports 6 are formed inside the body 2.

The fluid supply channels 7 integrally include a circular flow channel 7a formed concentrically around a central shaft portion (axis) of the body 2 and extending in the axial direction (see FIG. 4), a pair of left and right upward inclined channels 7b connecting the upper end (in FIG. 1) of the circular flow channel 7a to the pair of left and right fluid supply ports 6, and a lower circular flow channel 7c connecting to the lower end of the circular flow channel 7a. Air supply hoses H for forming external fluid supply channels are integrally connected to the fluid supply ports 6 through connectors (not shown). Each of the fluid supply channels 7 has a diameter smaller than that of the air supply hose H so that the pressure of a fluid, such as air or nitrogen gas, supplied to the fluid supply ports 6 from the air supply hose H can be increased through the fluid supply channel 7.

The air supply hoses H are then connected to an air compressor, as an example of a fluid supply source, through an air tank 99, as an example of a fluid storage tank. The air compressor stores a predetermined volume of air at a predetermined pressure in the air tank 99 and supplies the air to the fluid supply ports 6 of the non-contact holder 1.

The air tank 99 has a temperature controller 98 for suitably controlling the temperature of the air stored in the air tank 99. This temperature controller 98 can suitably control the temperature of the air stored temporarily in the air tank 99 to a required temperature for supply to the non-contact holder 1. The used temperature controller 98 may be replaced with, for example, a heat-pump refrigeration cycle device.

Thus, the temperature controller 98 can control the temperature of the air, which is blown through the non-contact holder 1 to the workpiece 5, to such a temperature as to prevent, for example, condensation on the workpiece 5 and damage such as spots.

Figure 4:
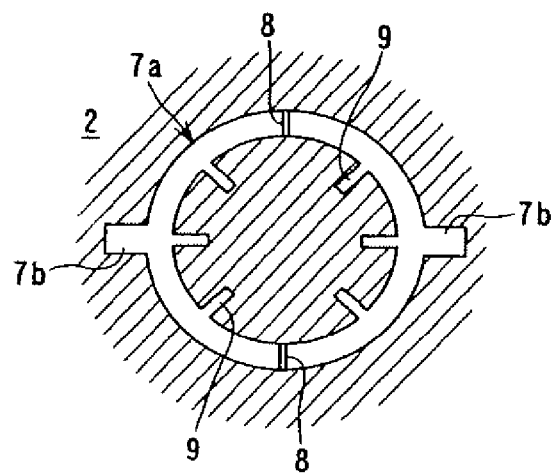
FIG. 4 is a sectional view taken along the line IV-IV in FIG. 1.

In the transverse (i.e., cross) sectional view of FIG. 4, the circular flow channel 7a is divided into a pair of left and right semicircular flow channels by a pair of upper and lower partitions 8. The partitions 8 extend along the length of the circular flow channel 7a and the lower circular flow channel 7c in the axial direction so as to prevent two flows of a fluid, such as air or nitrogen gas, supplied from the pair of left and right fluid supply ports 6 to the circular flow channel 7a from joining and causing a swirling flow.

In addition, axial flow guide grooves 9, as axial flow guides, are formed in, for example, the inner circumferential surface of the circular flow channel 7a at positions symmetric in the circumferential direction. The axial flow guide grooves 9 extend along the axial length of the shaft part, which couples the circular flow channel 7a to the lower circular flow channel 7c in the axial direction. Although the axial flow guide grooves 9 are rectangular in transverse cross-section with respect to the axial direction of the circular flow channel 7a and the lower circular flow channel 7c, the guide grooves may have a triangular shape, V-shape, polygonal shape, or arc-shape. Alternatively, the axial flow guides may be formed from projections, such as ribs, protruding to the inner side of the flow channels 7a and 7c, and the projections may also have a triangular shape, V-shape, polygonal shape, or arc-shape in transverse cross-section.

Figure 5:
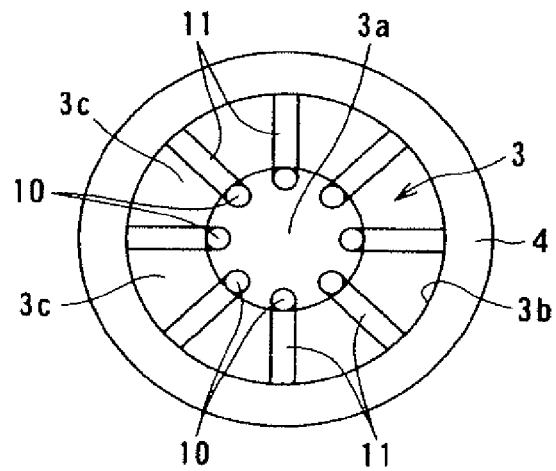
FIG. 5 is a bottom view of the non-contact holder shown in FIGS. 1 and 2.

Referring to FIG. 5, the ejection recess 3 is provided with discharge ports 10 each having a circular-shape and provided on the periphery of the inner bottom surface 3a at an equal pitch in the circumferential direction.

The discharge ports 10 are formed in the inner bottom surface 3a of the ejection recess 3 at positions adjacent to the tapered surface 3c so as to discharge a fluid such as air along the tapered surface 3c in the axial direction.

That is, the discharge port 10 is connected integrally to the lower circular flow channel 7c, and the upper end (in FIG. 1) of the lower circular flow channel 7c is in turn connected integrally to the lower end of the circular flow channel 7a.

Radial flow guide grooves 11, as radial flow guides, connecting to the discharge ports 10 are formed in the tapered surface 3c of the ejection recess 3. Each of the radial flow guide grooves 11 has substantially the same diameter as that of the discharge port 10 and a required depth. The radial flow guide grooves 11 extend radially outward from the center of the inner bottom surface 3a. The radial flow guide grooves 11 allow the air discharged from the discharge ports 10 to flow radially in the axial direction along the tapered surface 3c of the ejection recess 3.

Figure 6:
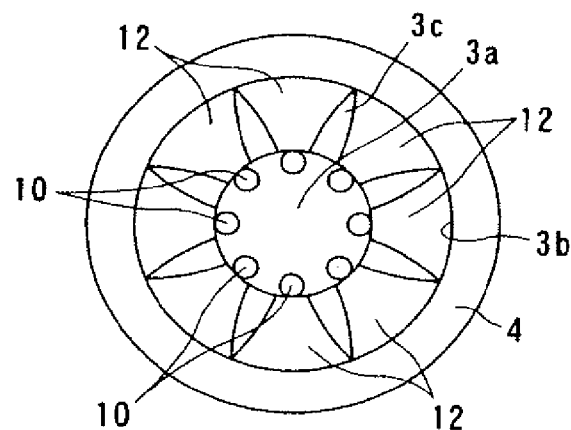
FIG. 6 is a bottom view of another example of radial flow guides according to the first embodiment of the present invention.

In FIG. 6, the radial flow guide grooves 11 may be replaced by divergent grooves 12 which diverge gradually from the discharge ports 10 toward the ejection opening 3b. In addition, although eight discharge ports 10 are provided in FIGS. 5 and 6, the number of the discharge ports 10 is not limited to eight, and the non-contact holder 1 may also be provided with two, three, four, five, six, seven, nine, ten or eleven, or more discharge ports 10. Furthermore, the discharge ports 10 may also be integrated into a circular outlet in the circumferential direction of the inner bottom surface 3a.

The depth of the divergent grooves 12 decreases gradually from the discharge ports 10 toward the ejection opening 3b to zero at the ejection opening 3b or in its vicinity. That is, the divergent grooves 12 are formed so as to be substantially flush with the portions of the tapered surface 3c between the adjacent divergent grooves 12 at the ejection opening 3b or in its vicinity. Further, the divergent grooves 12 extend radially outward from the center of the inner bottom surface 3a.

In the non-contact holder 1 having the structure mentioned above, a fluid, such as air, supplied to the pair of left and right fluid supply ports 6 at a predetermined pressure flows through the upward inclined channels 7b with increasing pressure so as to enter the upper end of the circular flow channel 7a. The partitions 8 prevent the two flows of air from joining. The air is guided by the axial flow guide grooves 9 to flow down through the semicircular flow channel 7a in the axial direction. After flowing through the lower circular flow channel 7c, the air is discharged from the discharge ports 10 toward the tapered surface 3c of the ejection recess 3 in the axial direction of the body 2.

The air, which has viscosity, discharged toward the tapered surface 3c flows toward the ejection opening 3b along the tapered surface 3c in the axial direction while being guided by the radial flow guide grooves 11 formed in the tapered surface 3c.

The viscosity of the air in the ejection recess 3 at a predetermined pressure allows the air to flow along the tapered surface 3c in the axial direction. As a result, the air is ejected as a radial flow externally from the ejection opening 3b as shown by the arrows.

Accordingly, when the ejection opening 3b of the non-contact holder 1 is brought close to a surface of the workpiece 5 with air being ejected from the ejection opening 3b, as shown in FIGS. 1 and 2, a radial flow of the air ejected from the ejection opening 3b is blown to the opposing surface of the workpiece 5. The air then flows radially outward along the opposing surface of the workpiece 5 to form a positive pressure region P where the radial flow of the air is blown to the workpiece 5 and form a negative pressure region M inside the radial flow between the ejection opening 3b and the opposing surface of the workpiece 5.

As a result, the air exerts a pushing force pushing the workpiece 5 away from the ejection opening 3b (downward in FIG. 1) in the positive pressure region P around the ejection opening 3b and a suction force sucking the workpiece 5 toward the ejection opening 3b in the negative pressure region M so that the workpiece 5 can be held with non contacted state due to the balance between the pushing force and the suction force.

The non-contact holder 1 can therefore avoid impressions and mechanical damage that occur when the workpiece 5 is mechanically held with, for example, a chuck or is sucked and held directly by a suction pad.

In addition, the non-contact holder 1 blows a radial flow of air, not a swirling flow of air, to the workpiece 5 to thereby statistically hold the workpiece 5 and transfer it with non-contacted (or non-contacting) state without being rotated. When, therefore, the workpiece 5 is transferred to another place and placed at a predetermined position while being held by the non-contact holder 1 with non-contacted state, the workpiece 5 can be positioned at accuracy higher than in the case where the workpiece 5 is rotated.

The workpiece 5 can be held statistically using the single non-contact holder 1. Unlike the known non-contact holder that causes a swirling flow, therefore, there is no need for arranging at least two non-contact holders to stop the rotation of the workpiece 5. This can contribute to the reductions in the number of non-contact holders 1 installed and the reduction of noise such as wind noise caused when swirling flows produced by the two adjacent non-contact holders collide with each other and cancel each other. The air supply rate and pressure, and the power cost of, for example, the air compressor (not shown) for supplying air through the air supply hoses H can be also reduced.

In addition, because the workpiece 5 can be held statistically using the single non-contact holder 1, unlike the known non-contact holder, the stress and vibration, which occur on the workpiece 5 when two or more swirling flows are blown to the workpiece 5 in different directions, can be reduced. According to the non-contact holder 1 of the present invention, it is possible to improve the soundness of the workpiece 5 and decrease the noise.

In the non-contact holder 1, the partitions 8 divide the circular flow channel 7a into semicircles to prevent the flows of the air supplied from the pair of left and right fluid supply ports 6 from joining and causing a swirling flow. In addition, the partitions 8 allow the air flowing through the semicircular flow channels 7a to flow along the axial flow guide grooves 9, as the axial flow guides, in the axial direction. Thus, the partitions 8 forcibly control the air so as not to cause a swirling flow.

The radial flow guides 11 formed on the tapered surface 3c keep the air discharged from the discharge ports 10 into the ejection recess 3 flowing radially so as to prevent or reduce a swirling flow in the air and then prevent or reduce a turbulent flow in the air.

The flat end surface 4 is formed at the outer edge around the ejection opening 3b. This flat end surface 4 can facilitate the escape of the radial flow blowing to the workpiece 5 from the ejection opening 3b and flowing outward to reduce the rate of air supplied. In addition, if the workpiece 5 collides with the flat end surface 4 for some reason, the workpiece 5 suffers less damage.

In the non-contact holder 1, the discharge ports 10 are provided at positions opposing to each other around the central axis of the body 2 to substantially uniformly distribute the rate and pressure of radial flow of air blowing to the workpiece 5 from the ejection opening 3b in the circumferential direction of the ejection opening 3b.

Thus, the non-contact holder 1 can uniformly distribute the suction force and the pushing force acting on the workpiece 5 to thereby prevent or reduce the inclination of the workpiece 5 held in the non-contacted state and to effectively achieve a self-centering function.

That is, if the non-contact holder 1 holds the workpiece 5 with non-contacted state, with the center thereof deviating from the center of the ejection opening 3b, the area on which the positive pressure region P and the negative pressure region M act becomes larger on the side to which the workpiece 5 deviates than on the opposite side. As a result, the workpiece 5 becomes inclined, and a moving moment due to the inclination moves the workpiece 5 so that the center thereof aligns with the center of the ejection opening 3b.

If the body 2 is made of quartz glass, the contamination of, for example, semiconductor wafers and silicon wafers may be prevented or reduced because the quartz glass releases substantially no amount of contaminant gas.

The air hoses H are connected to the air supply source, such as an air compressor, through the air tank (not shown). If the air compressor stops in its operation for some reason while the non-contact holder 1 is holding the workpiece 5 with non-contacted state, the air stored in the air tank can be successively supplied to the non-contact holder 1 for a predetermined time. Thus, before the air supply runs out, the workpiece 5 will be able to be placed on a predetermined stage for dealing with accidents such as damage due to a sudden drop.

The temperature controller in the air tank can suitably control the temperature of the air supplied to the non-contact holder 1 to thereby prevent or reduce the generation of dewing or condensation on the workpiece 5.

The non-contact holder 1 has a plurality of fluid supply ports 6 and a plurality of fluid supply channels 7 connected to the fluid supply ports 6. The fluid supply ports 6 and the fluid supply channels 7 may be supplied with a fluid, such as air, at a higher rate to increase the rate of air blowing against the workpiece 5 from the ejection recess 3. The non-contact holder 1 can therefore hold a heavy or large workpiece 5 with non-contacted state.

Moreover, the fluid supply ports 6 are formed on the peripheral surface of the body 2 in the radial direction, namely in the transverse direction, rather than at an end of the body 2 in the axial direction, namely the top end of the body 2. The height of the body 2 is smaller than the overall height of the body 2 in the case where the fluid supply ports 6 are formed at the top end of the body 2 and the air supply hoses H are connected to the fluid supply ports 6. The overall height includes the height of an upstanding portion of the air supply hose H which stands upright from the top end of the body 2. Accordingly, the non-contact holder 1 has a reduced height and can thus be inserted into the gap between workpieces 5 disposed on multiple stages. In addition, the gap between the workpieces 5 disposed on the multiple stages may be reduced to increase the number of stages on which the workpieces 5 are placed.

In the first embodiment mentioned above, the axial flow guide grooves 9 are formed on the inner circumferential surface of the circular flow channel 7a, although the present invention does not limit these positions to the inner circumferential surface, and for example, the axial flow guide grooves 9 may be formed on the outer circumferential surface of the circular flow channel 7a, or may be formed on both the inner and outer circumferential surfaces. Moreover, the radial flow guides 11 may also be partially formed, for example, only in the vicinity of the discharge ports 10 or the ejection opening 3b, rather than along the length from the discharge ports 10 to the ejection opening 3b.

Furthermore, in the first embodiment, although both the axial flow guide grooves 9 and the radial flow guides 11 are formed, only one or none of them may be provided. Even if both the axial flow guide grooves 9 and the radial flow guides 11 are not disposed, the viscosity of the air discharged from the discharge ports 10 of the ejection recess 3 toward the tapered surface 3c in the axial direction allows the air to flow along the tapered surface 3c.

FIGS. 7 to 12 are elevational sections of non-contact holders 1A to 1E according to first to fifth modifications (modified embodiments) of the non-contact holder 1 of the first embodiment of the present invention.

Figure 7:
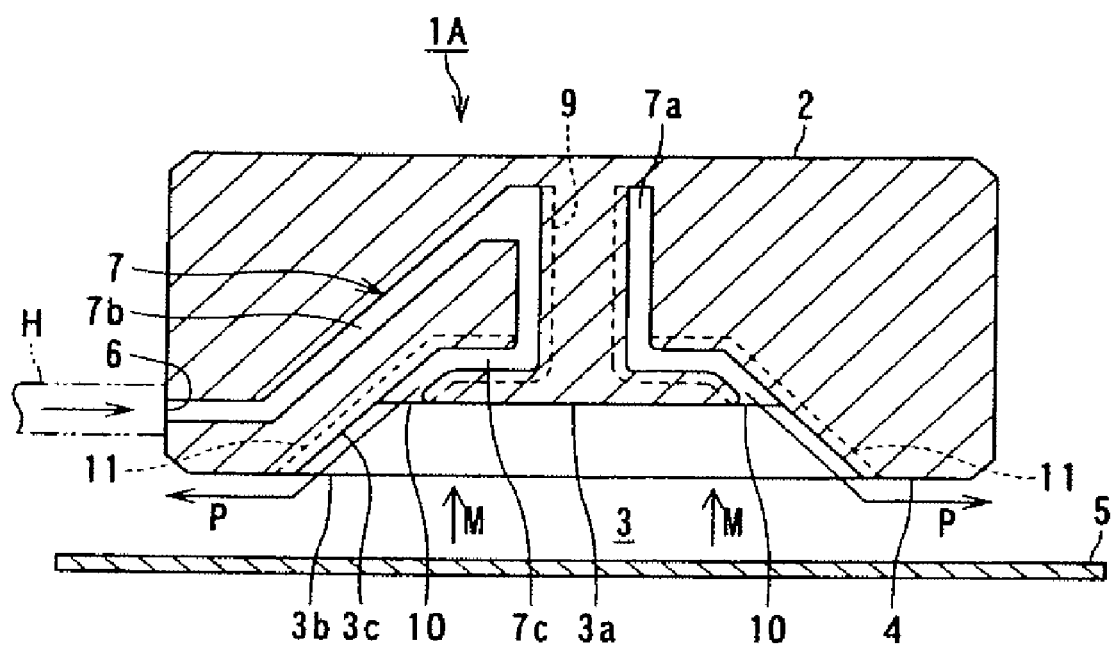
FIG. 7 is an elevational sectional view of a first modification in the first embodiment of the present invention.

Referring to FIG. 7, the non-contact holder 1A according to the first modification is characterized in that the holder 1A is not provided with one of the pair of left and right fluid supply ports 6, one of the pair of left and right upward inclined fluid channels 7b connected to the fluid supply ports 6, and the pair of partitions 8 in the circular flow channel 7b in FIG. 4. The other structure is substantially the same as that of the non-contact holder 1 shown in FIG. 1.

The non-contact holder 1 therefore is operated in substantially the same manner as that of the non-contact holder 1 in FIG. 1. In addition, because one of the fluid supply ports 6, one of the upward inclined fluid channels 7b, and one of the partitions 8 can be omitted, the non-contact holder 1A has a simple and compact structure, and the workability can be also improved.

Furthermore, since the pair of partitions 8 in the circular flow channel 7a are omitted, a swirling flow of air may occur in the circular flow channel 7a. The swirling flow, however, will be prevented or reduced by the formation of the axial flow guide grooves 9, and further prevented or reduced by the radial flow guide grooves 11 in the tapered surface 3c.

Figure 8:
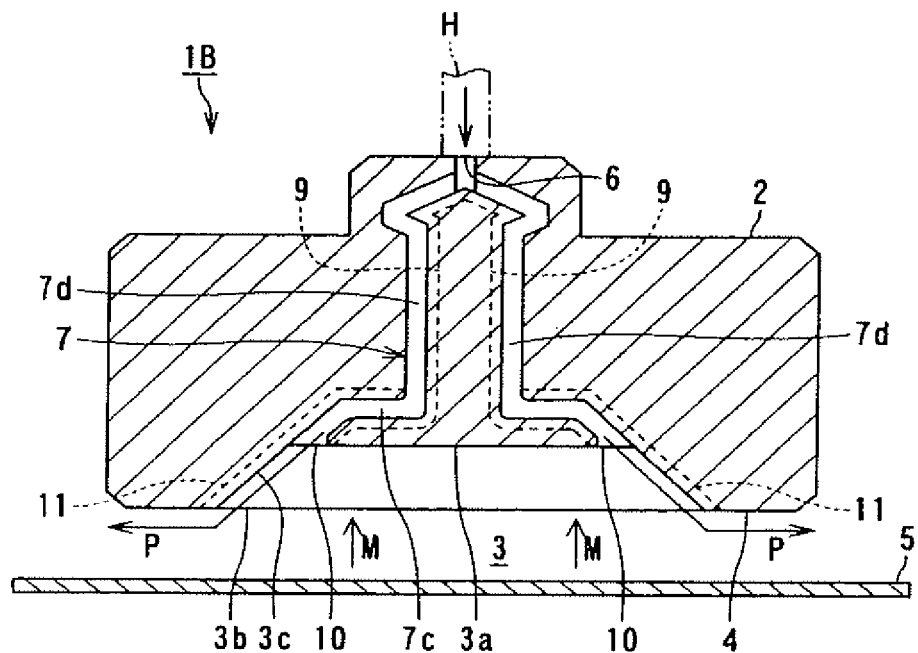
FIG. 8 is an elevational sectional view of a second modification in the first embodiment of the present invention.

Referring to FIG. 8, the non-contact holder 1B according to the second modification is characterized in that a single fluid supply port 6 is provided in the center of the top end of the body 2 of the non-contact holder 1 shown in FIG. 1, and air from the fluid supply port 6 is shared and flows through axial flow channels 7d connected to the discharge ports 10, which discharge the air toward the tapered surface 3c.

Figure 9:
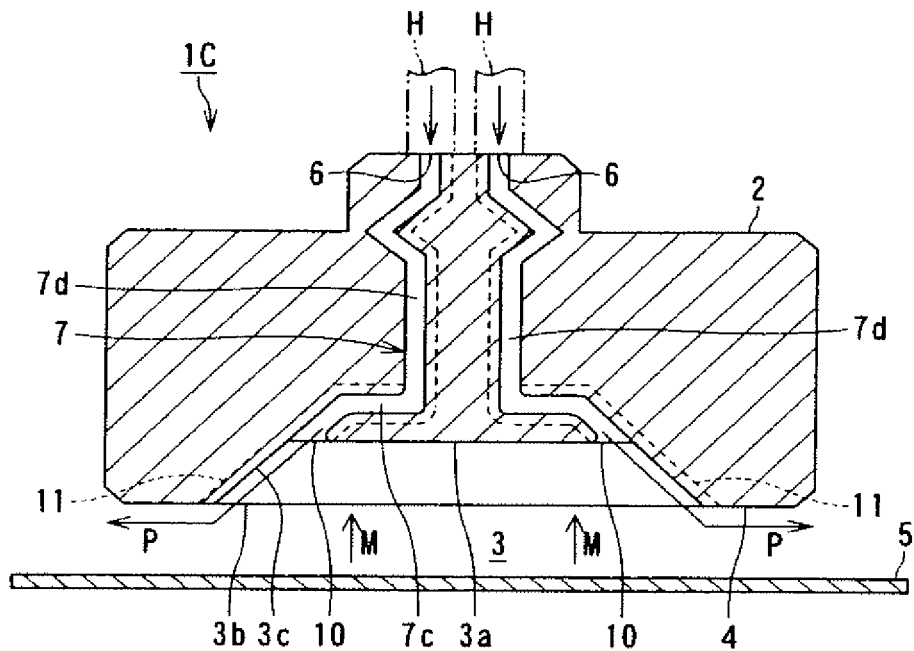
FIG. 9 is an elevational sectional view of a third modification in the first embodiment of the present invention.

Referring to FIG. 9, the non-contact holder 1C according to the third modification is characterized in that a plurality of fluid supply ports 6 in the non-contact holder 1B shown in FIG. 8 as second modification are provided in parallel with each other at the top end of the body 2 of the non-contact holder 1C.

Figure 10:
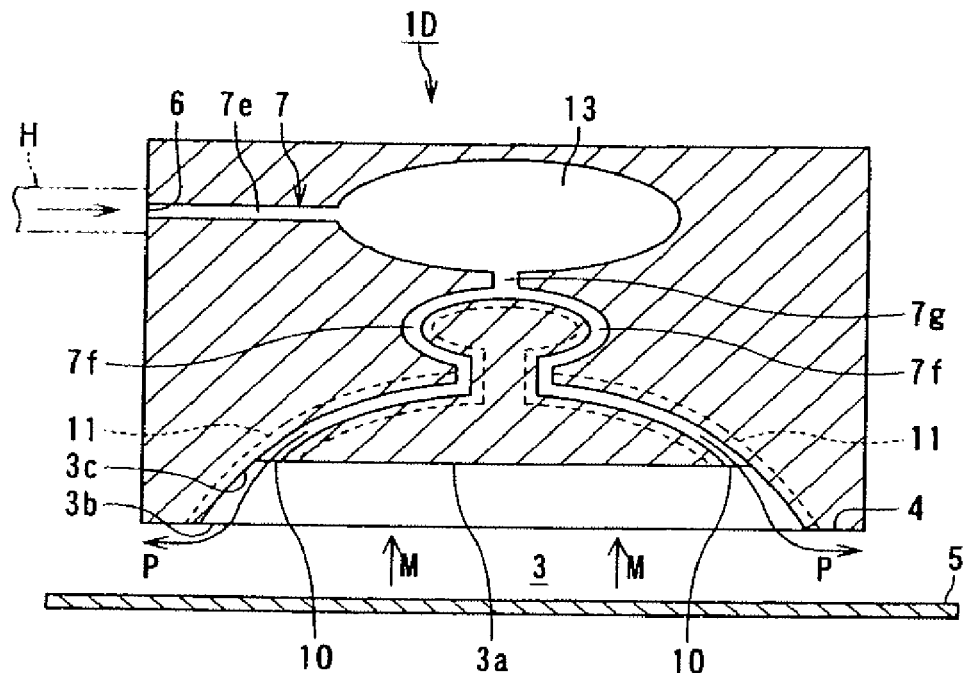
FIG. 10 is an elevational sectional view of a fourth modification in the first embodiment of the present invention.

Referring to FIG. 10, the non-contact holder 1D according to the fourth modification is characterized in that an air reservoir 13, which for example, has an oval-sphere-shape, is provided inside the body 2.

The air reservoir 13 is disposed at an intermediate portion of an air supply flow channel 7 connecting a single fluid supply port 6 to the discharge ports 10 in the ejection recess 3.

Specifically, the air reservoir 13 is communicated with an end of a transverse flow channel 7e connected to the fluid supply port 6 and also connected to a confluent flow channel 7g of branch flow channels 7f. Leading ends (the bottom ends in FIG. 10) of the branch flow channels 7f are connected to the discharge ports 10.

In the non-contact holder 1D according to this fourth modification, the air reservoir 13 can prevent or reduce the pulsation of the air supplied from the fluid supply port 6 to the air supply flow channel 7 so as to recover static pressure. Furthermore, in the case where the air compressor stops in its operation, the air can be successively supplied by the air reservoir 13 to the discharge ports 10 for a predetermined time. The supply from the air reservoir 13 can prevent the workpiece 5 from dropping at the moment when the air compressor stops.

Figure 11:
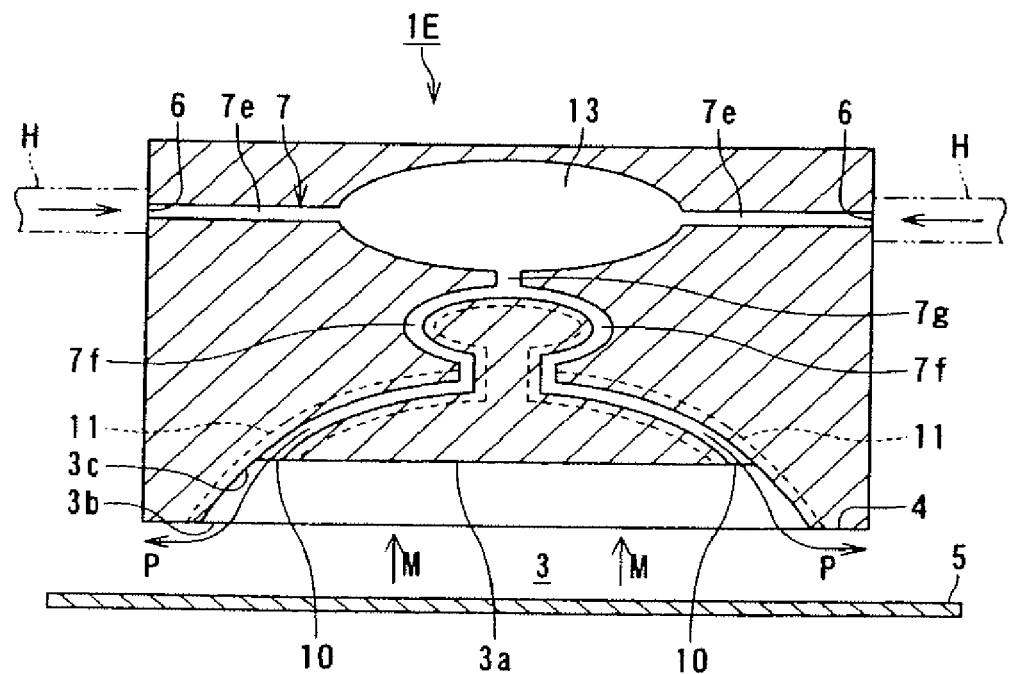
FIG. 11 is an elevational sectional view of a fifth modification in the first embodiment of the present invention.

Referring to FIG. 11, the non-contact holder 1E according to the fifth modification is characterized in that a pair of left and right transverse flow channels 7e and a pair of left and right fluid supply ports 6 connected to the air reservoir 13 are provided in the non-contact holder 1D of the fourth modification in FIG. 10.

The non-contact holder 1E provided with the air reservoir 13 is operated in substantially the same manner as that of the non-contact holder 1D of the fourth modification in FIG. 10. The non-contact holders 1B to 1E may have two or more fluid supply channels 7 and two or more discharge ports 10 connected to the fluid supply channels 7, and the discharge ports 10 may be provided at positions opposite to each other around the center of the inner bottom surface 3a in the ejection recess 3.

Second Embodiment

Figure 12:
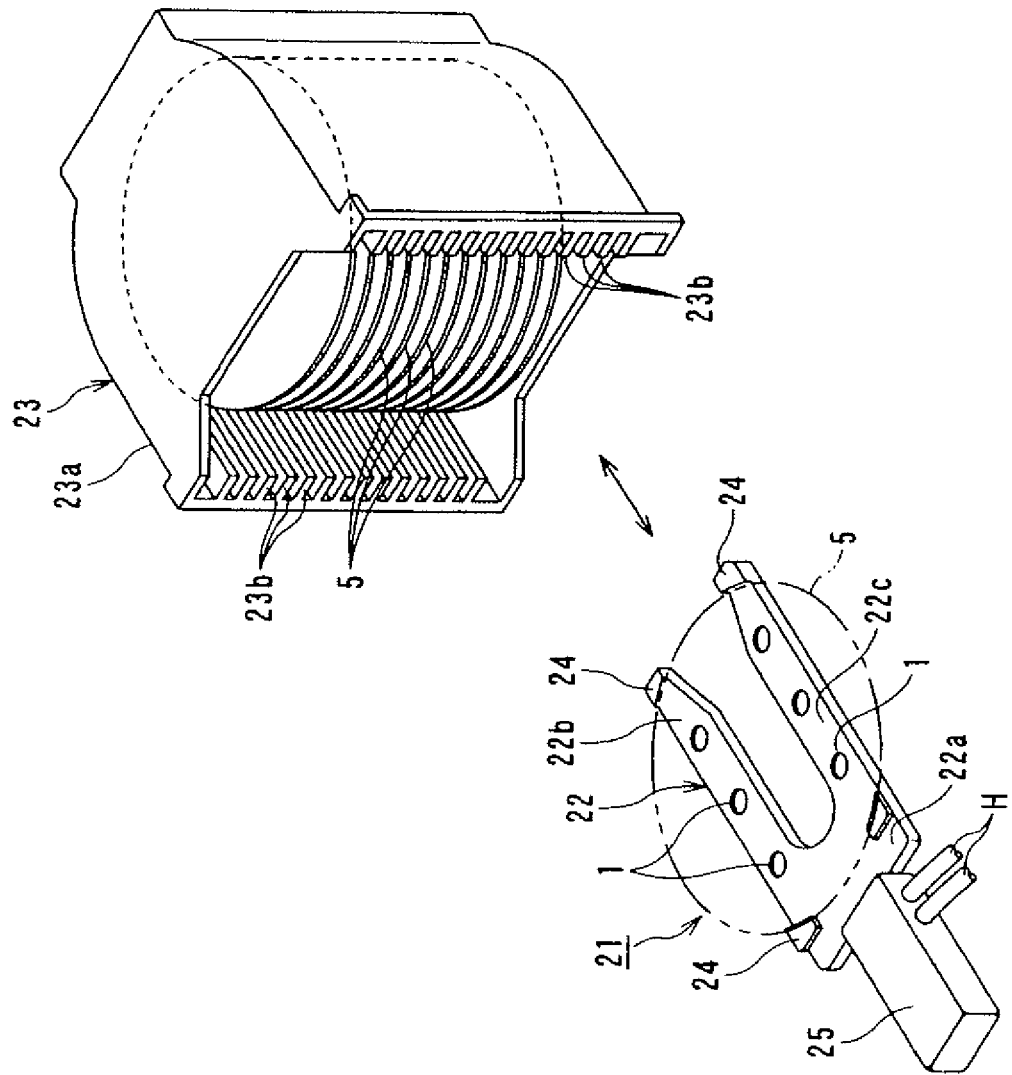
FIG. 12 is a perspective view of a hand-type non-contact holding device according to a second embodiment of the present invention.

FIG. 12 is a perspective view illustrating the using condition of a hand-type non-contact holding device 21 according to a second embodiment of the present invention.

This hand-type non-contact holding device 21 includes a substrate 22 formed from, for example, a substantially U-shaped thin plate. A plurality of the non-contact holders (either one of them 1, 1A, 1B, 1C, 1D or 1E), for example a plurality of the non-contact holders 1, are provided on a surface of the substrate 22. This hand-type non-contact holding device 21 holds a workpiece 5, such as a semiconductor wafer or a silicon wafer, stored in a wafer cassette 23 in the non-contacted state to take it out of the wafer cassette 23, or holds the workpiece 5 in the non-contacted state to insert it into the wafer cassette 23.

The substrate 22 has a base portion 22a and two branch portions 22b and 22c extending from the base portion 22a. The base portion 22a and the branch portion 22b and 22c are integrally formed so as to provide a substantially U-shaped holding member. A plurality of non-contact holders 1 are arranged symmetrically on flat surfaces (the top surfaces in FIG. 12) of the branch portions 22b and 22c with the ejection openings 3b thereof facing upward (in FIG. 12). The substrate 22 has a thickness capable of being inserted between the adjacent workpieces 5 stacked in the wafer cassette 23.

Four stoppers 24, for example, are disposed so as to protrude from the corners of a holding surface (the top surface in FIG. 12) of the substrate 22 for holding the workpieces 5. The stoppers 24 are arranged so as to surround and support the workpiece 5 at, for example, four positions on the circumferential surface thereof at equal intervals in the circumferential direction with a slight play.

Figure 13:
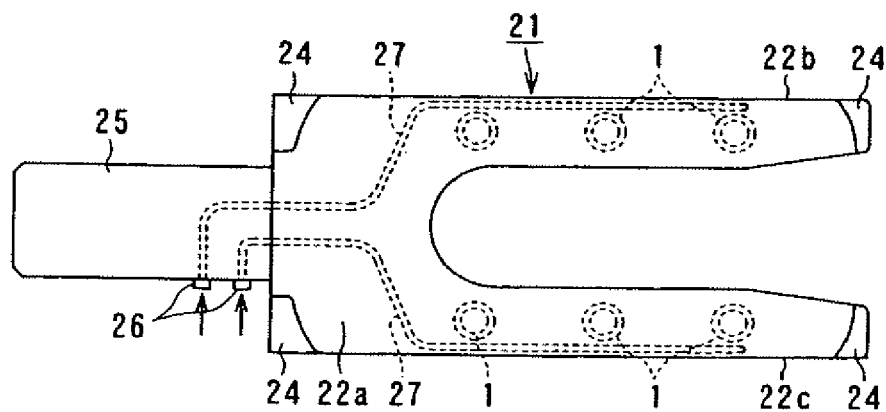
FIG. 13 is a plan view of the hand-type non-contact holding device shown in FIG. 12.

A grip portion 25 is formed substantially integrally with the out side surface of the base portion 22a of the substrate 22. Referring to FIG. 13, air inlet ports 26 for connecting two air supply hoses H are formed on a side surface of the grip portion 25 near the base portion 22a.

The air inlet ports 26 are connected respectively to the fluid supply ports 6 of the non-contact holders 1 through two air supply channels 27 formed inside the U-shaped substrate 22.

The grip portion 25 has such a size and shape to be held by had of an operator. The grip portion 25 may also be formed to be attached to and detached from a movable arm of a mobile robot (not shown), as an example of a movable unit. In this case, the positions of the air supply hoses H will be suitably changed as occasion demands. The grip portion 25 has an operating portion (not shown) for operating control valves to thereby control the rate of air to be supplied to the respective non-contact holders 1.

The wafer cassette 23 is composed of a rectangular cassette casing 23a for storing wafers such as silicon wafers. The cassette casing 23a has an opening for insertion of the wafers and storing grooves 23b for storing the wafers so as to be inserted and taken out. The storing grooves 23b are formed at a desired pitch in the axial direction.

An operator holds the grip portion 25 of the hand-type non-contact holding device 21 of the structure mentioned above by hand, inserts the U-shaped substrate 22 between the workpieces 5 stacked in the wafer cassette 23 with the ejection openings 3b of the non-contact holders 1 facing upward, as shown in FIG. 12, and positions the substrate 22 under the bottom surface of the required workpiece 5. Air supply to the non-contact holders 1 is then started by operating the control valve to hold the bottom surface of the required workpiece 5 with the non-contacted state and take it out of the wafer cassette 23.

On the other hand, when the workpiece 5 is inserted and stored in a predetermined storing groove 23a in the wafer cassette 23, the workpiece 5 is held on the hand-type non-contact holding device 21 in the non-contacted state, as shown in FIG. 12, inserted into the storing groove 23b, and placed by, for example, stopping the air supply. Subsequently, only the substrate 22 is drawn out of the wafer cassette 23.

That is, the required workpiece 5 can be manually taken out of or inserted into the wafer cassette 23 with the hand-type non-contact holding device 21 of this embodiment. Further, if the grip portion 25 of the hand-type non-contact holding device 21 is mounted to an arm of a robot, the robot can hold and carry the workpiece 5 in the non-contacted state by using the hand-type non-contact holding device 21.

The non-contact holders 1 provided on the hand-type non-contact holding device 21, as described above, eject air in radial flow, rather than swirling flow of air, from the ejection openings 3b. The non-contact holders 1 can therefore be arranged adjacent to each other with no consideration of the swirling flows directed in opposite directions. Accordingly, the hand-type non-contact holding device 21 can achieve the same operation and effects as those of the non-contact holder 1 mentioned before, easiness of manufacture and reductions of vibration and noise of the workpiece 5.

Figure 14:
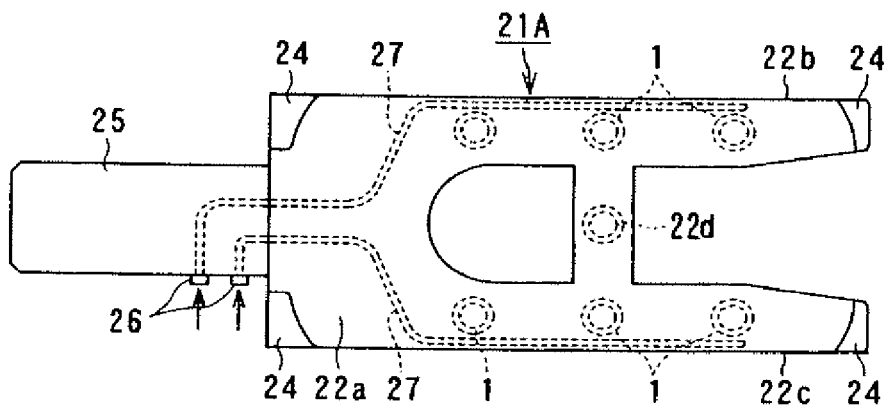
FIG. 14 is a plan view of a modification of the hand-type non-contact holding device shown in FIG. 12.

As shown in FIG. 14, a hand-type non-contact holding device 21 (21A) may have a cross plate 22d formed integrally with the pair of branch portions 22b and 22c at the intermediate portions thereof in the longitudinal direction, and another non-contact holder 1 may be provided in the center of the cross plate 22d.

According to the hand-type non-contact holding device 21A, another non-contact holder 1 may be provided at a position corresponding to substantially the center of the workpiece 5, thus enhancing both the stability and reliability in the non-contact holding of the workpiece 5. Alternatively, the substrate 22 may be formed into a simple rectangle or circle.

Third Embodiment

Figure 15:
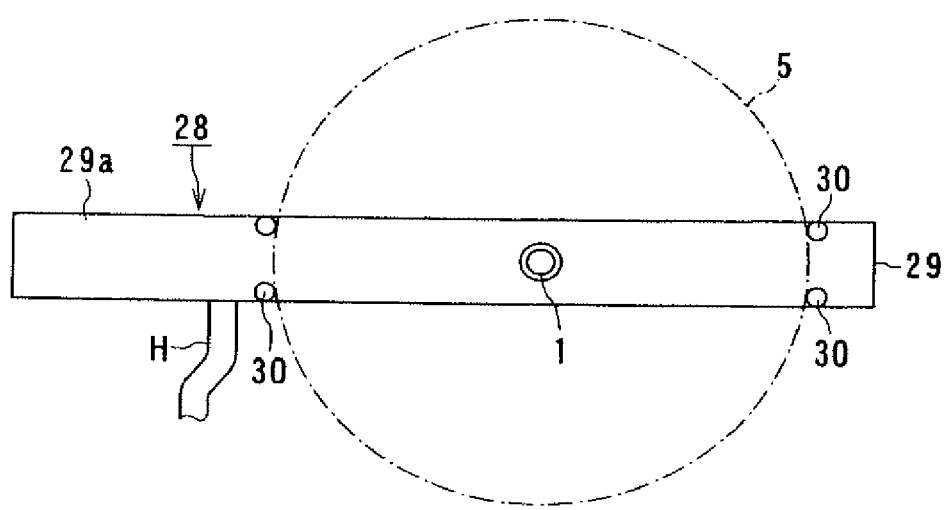
FIG. 15 is a front view of non-contact tweezers according to a third embodiment of the present invention.

FIG. 15 is an illustrated front view of non-contact tweezers 28 according to a third embodiment of the present invention. The non-contact tweezers 28 include a body 29 having a small-stick shape and a grip portion 29a disposed at an end of the body 29. The grip portion 29a can be held with, for example, operator's fingers. Any of the non-contact holders 1 and 1A to 1E, for example, the non-contact holder 1, is provided on the way of the body 29 at an intermediate portion in the axial direction. Stopper pins 30 for holding both sides of the workpiece 5 in the diameter direction are provided on the surface of the body 29. An air supply hose H is connected to an air inlet (not shown) disposed to the grip portion 29a near the stopper pins 30. The air inlet is connected to the fluid supply ports of the non-contact holder 1 through an air supply channel (not shown) formed inside the body 29. The body 29 has an operating portion (not shown) for operating a control valve to control the rate of air supplied from the air supply hose H to the non-contact holder 1.

The non-contact tweezers 28 can hold an object to be held, such as a small workpiece 5, e.g., a small-diameter silicon wafer or semiconductor wafer or a small precision component, in the non-contacted or contacting state and transfer the object in this state.

The rate of air supplied to the non-contact holder 1 can be suitably controlled by operating the operating portion of the control valve according to the size and shape of the object in the non-contacted state.

The body 29 of the non-contact tweezers 28 may have a pencil-shape with a size and a form approximately equivalent to those of a writing instrument such as a pencil or a mechanical pencil. Alternatively, the body 29 may also have a pencil-shape with its leading end bent at a desired angle and provided with the non-contact holder 1.

Fourth Embodiment

Figure 16:
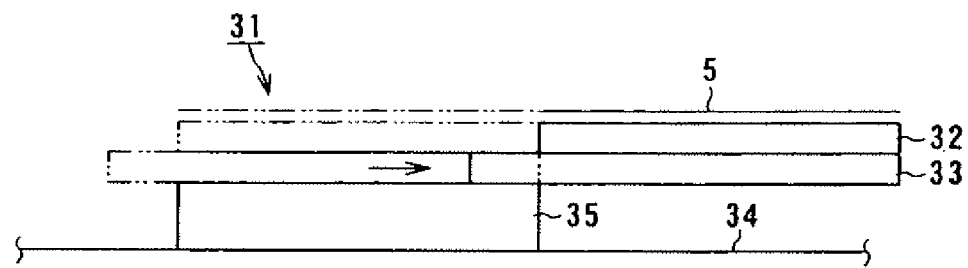
FIG. 16 is a side view of a non-contact holding device according to a fourth embodiment of the present invention.

FIG. 16 is a side view of a non-contact holding and transferring device 31 according to a fourth embodiment of the present invention. This non-contact holding and transferring device 31 includes a movable table 33, as a movable member for supporting a panel-type non-contact holding unit 32 shown in FIG. 17 to be movable in the horizontal direction and a shuttle 35 which is reciprocally transferred on a transfer path line 34, such as a belt transfer unit 35 such as a self-propelled unit which moves on the transfer path 34.

Figure 17:
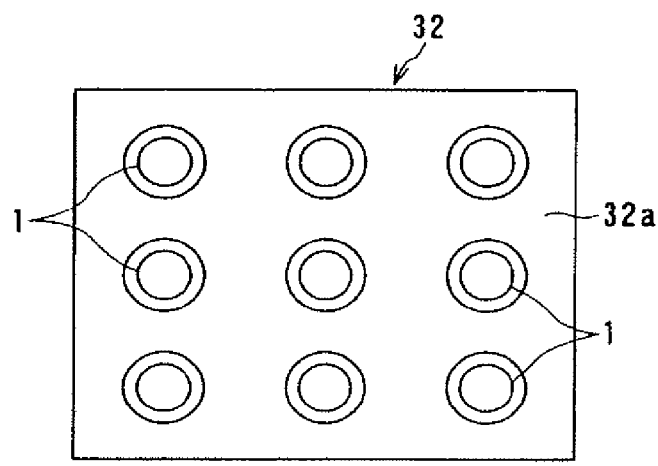
FIG. 17 is a plan view of a panel-type non-contact holding and carrying unit shown in FIG. 16.
Figure 18:
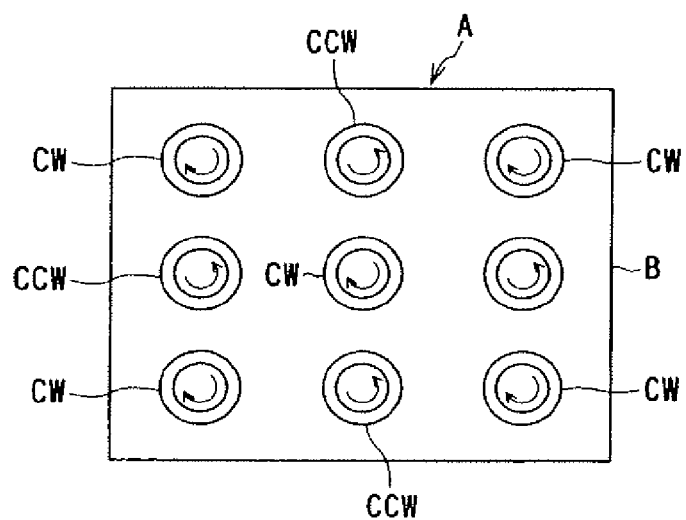
FIG. 18 is a plan view of a known panel-type non-contact holding unit.

Referring to FIG. 17, the panel-type non-contact holding unit 32 is composed of, for example, a rectangular panel substrate 32a on which a plurality of the non-contact holders 1, 1A, 1B, 1C, 1D, or 1E, for example the non-contact holders 1, are arranged in three columns by three rows to hold a workpiece 5 in the non-contacted state.

In FIG. 16, the panel-type non-contact holding unit 32 is detachably placed on the movable table 33, which is mounted on the transferring unit 35 movably in the horizontal direction. While the transferring unit 35 moves to a predetermined position, the movable table 33 moves in the horizontal direction by, for example, sliding to move the panel-type non-contact holding unit 32 and transfer the workpiece 5 held thereon in the non-contacted state to a subsequent step such as a processing step or an inspection step.

According to this non-contact holding and transferring device 31, the transferring unit 35 can transfer the workpiece 5 to a place at which the workpiece 5 is transferred to the subsequent step, and the movable table 33 can move the panel-type non-contact holding unit 32 in the horizontal direction to transfer the workpiece 5 to the subsequent step.

After transferring the workpiece 5 to the subsequent step, the movable table 33 returns to its original position on the transferring unit 35, which then returns to its original position while transferring the movable table 33 on the transferring path. The panel-type non-contact holding unit 32 then holds another workpiece 5 with the non-contacted state, and the transferring unit 35 moves the panel-type non-contact holding unit 32 to the place at which the workpiece 5 is transferred to the subsequent step. This operation may be repeated to transfer the workpieces 5 in the non-contacted state to a desired place, for example, a place at which the workpieces are transferred to the subsequent step.

In addition, the non-contact holding and transferring device 31, which has the non-contact holders 1, 1A, 1B, 1C, 1D, or 1E according to the present invention as non-contact holders for holding a workpiece 5 in the non-contacted state, achieves substantially the same functions and effects as those of the non-contact holders 1 and 1A to 1E.

A monorail provided on the ceiling of a factory may be utilized as transferring path 34. In this case, the transferring unit 35 utilizes a gondola reciprocating on the monorail, and the panel-type non-contact holding unit 32 holds a workpiece 5 upside down in the non-contacted state. The panel-type non-contact holding unit 32 can hold the workpiece 5 upside down in the non-contacted state without dropping it and can also hold the workpiece 5 vertically in the non-contacted state.

The invention claimed is:

1. A non-contact holder comprising:
   a body having an ejection recess having an ejection opening from which a fluid is ejected and a side surface gradually diverging toward the ejection opening;
   discharge ports provided at positions adjacent to the side surface of the ejection recess of the body to discharge the fluid along the side surface in the axial direction;
   a first fluid supply channel provided inside the body and connected to the discharge ports to supply the fluid to the discharge ports;
   a flat end surface formed integrally with an outer edge of the body around the ejection opening so as to oppose to a surface of an object to be held opposing to the ejection opening to guide the flow of the fluid to an outside of the opposing surface of the object to be held; and
   a plurality of second fluid supply channels disposed to be connected respectively to fluid supply ports provided in a peripheral surface of the body in the radial direction.

2. The non-contact holder according to claim 1, wherein radial flow guides are formed on the side surface of the ejection recess to guide the flow of the fluid discharged from the discharge ports radially outward from a center of the inner bottom surface of the ejection recess.

3. The non-contact holder according to claim 2, wherein the radial flow guides are grooves or protrusions.

4. The non-contact holder according to claim 1, wherein the first fluid supply channel includes axial flow guides for guiding the flow of the fluid to be discharged from the discharge ports to the side surface of the ejection recess in the axial direction of the side surface of the ejection recess.

5. The non-contact holder according to claim 4, wherein the axial flow guides are grooves or protrusions.

6. The non-contact holder according to claim 1, wherein the first fluid supply channel has a fluid reservoir for storing a required amount of the fluid on a way thereof.

7. The non-contact holder according to claim 1, wherein the discharge ports are provided at positions opposing to each other around the center of the inner bottom surface of the ejection recess, and radial flow guides extend from the discharge ports to the ejection opening.

8. The non-contact holder according to claim 7, wherein the radial flow guides are divergent grooves having a width gradually increasing from the discharge ports to the ejection opening and a depth gradually decreasing from the discharge ports to the ejection opening, the divergent grooves being substantially flush with the side surface at the ejection opening or in the vicinity thereof.

9. The non-contact holder according to claim 1, wherein the body comprises quartz glass.

10. The non-contact holder according to claim 1, wherein the object is a Bass plate, a sheet, a resin semiconductor wafer, or a display panel.

11. The non-contact holder according to claim 1, further comprising: a fluid storage tank provided on a way of an external fluid supply channel for connecting the first fluid supply channel of the body to a fluid supply source to store a required amount of fluid; and a fluid temperature controller for controlling a temperature of the fluid stored in the fluid storage tank.

12. The non-contact holder according to claim 1, further comprising: a grip portion provided on the body so as to be held thereby; and a stopper provided on the body to restrict a displacement of the workpiece to the outside of the outer peripheral surface thereof.

13. The non-contact holder according to claim 12, wherein the grip portion is formed so as to be attached to and detached from a movable unit.

14. A non-contact holding and transferring device comprising:
   a panel having a plurality of the non-contact holders according to claim 1 further including;
   a movable member which supports the panel reversibly movably in a horizontal direction thereof; and
   a transferring unit for transferring the movable member.

15. The non-contact holder according to claim 1, wherein the holder is coupled to a transferring device comprising:
   a panel having a plurality of the non-contact holders;
   a movable member which supports the panel reversibly movably in a horizontal direction thereof; and
   a transferring unit for transferring the movable member.

* * * * *